US012622089B2

(12) United States Patent
Nakayashiki et al.

(10) Patent No.: US 12,622,089 B2
(45) Date of Patent: May 5, 2026

(54) SOLAR CELL

(71) Applicant: REC SOLAR PTE. LTD., Singapore (SG)

(72) Inventors: Kenta Nakayashiki, Singapore (SG); Shu Yunn Chong, Singapore (SG); Ngeah Theng Chua, Singapore (SG)

(73) Assignee: REC SOLAR PTE. LTD., Singapore (SG)

( * ) Notice: Subject to any disclaimer, the term of this patent is extended or adjusted under 35 U.S.C. 154(b) by 0 days.

(21) Appl. No.: 18/260,052

(22) PCT Filed: Dec. 20, 2021

(86) PCT No.: PCT/EP2021/086830
§ 371 (c)(1),
(2) Date: Jun. 30, 2023

(87) PCT Pub. No.: WO2022/144210
PCT Pub. Date: Jul. 7, 2022

(65) Prior Publication Data
US 2024/0063314 A1      Feb. 22, 2024

(30) Foreign Application Priority Data

Dec. 30, 2020      (GB) ..................................... 2020730

(51) Int. Cl.
*H10F 77/20*          (2025.01)
*H10F 10/166*       (2025.01)
(52) U.S. Cl.
CPC ......... *H10F 77/244* (2025.01); *H10F 10/166* (2025.01); *H10F 77/247* (2025.01); *H10F 77/251* (2025.01)

(58) Field of Classification Search
CPC .... H10F 77/244; H10F 77/247; H10F 77/251; H10F 10/166
See application file for complete search history.

(56) References Cited

U.S. PATENT DOCUMENTS

| | | | | |
|---|---|---|---|---|
| 2010/0018577 A1* | 1/2010 | Nishiwaki | ............. | H10F 77/211 |
| | | | | 438/73 |
| 2012/0055534 A1* | 3/2012 | Leschkies | ............... | H10F 77/12 |
| | | | | 257/E31.119 |
| 2019/0198698 A1* | 6/2019 | Cui | ....................... | H10F 71/138 |

FOREIGN PATENT DOCUMENTS

| | | |
|---|---|---|
| CN | 1269225 C | 5/2004 |
| CN | 1495914 A | 5/2004 |

(Continued)

OTHER PUBLICATIONS

Great Britain Search Report imailed Sep. 24, 2021 in Great Britian Application No. GB2020730.4, a corresponding foreign application, 2 pages.

(Continued)

*Primary Examiner* — Lindsey A Buck

(74) *Attorney, Agent, or Firm* — Lee & Hayes, P.C.

(57) ABSTRACT

A solar cell comprising a crystalline silicon substrate, a semiconductor layer arranged on a back surface of the substrate which is configured not to face a radiative source, when the solar cell is in use, and a transparent-conductive region arranged on a surface of the semiconductor layer, wherein the transparent conductive region comprises: a first layer having a first work function; and a second layer having a second work function and being interposed between the first layer and the semiconductor layer; wherein the second work function of the second layer is greater than the first work function of the first layer.

20 Claims, 3 Drawing Sheets

(56)     References Cited

FOREIGN PATENT DOCUMENTS

| CN | 103077976 | A  | 5/2013  |
|----|-----------|----|---------|
| CN | 103531647 | B  | 11/2015 |
| CN | 110310999 | A  | 10/2019 |
| CN | 110416328 | A  | 11/2019 |
| CN | 210156386 | U  | 3/2020  |
| CN | 111653644 | A  | 9/2020  |
| EP | 2669952   | A1 | 12/2013 |
| TW | 201330291 | A  | 7/2013  |

OTHER PUBLICATIONS

International Search Report and Written Opinion mailed Mar. 25, 2022 in International Application No. PCT/EP2021/086830, 14 pages.

* cited by examiner

SOLAR CELL

CROSS REFERENCE TO RELATED APPLICATIONS

This application is a U.S. National Phase of International Application No. PCT/EP2021/086830 filed Dec. 20, 2021, which claims priority to Great Britain Application No. GB 2020730.4 filed Dec. 30, 2020, both of which are incorporated herein by reference in their entirety.

FIELD OF THE DISCLOSURE

The present disclosure relates to solar cells and methods for forming the same.

BACKGROUND

Solar modules for providing electrical energy from sunlight comprise an array of solar/photovoltaic cells, each comprising a multi-layer semiconductor structure arranged between one or more front and back electrodes.

The substrate typically forms a p-n junction with an emitter layer which is arranged on a surface of the substrate (i.e. one of the substrate and emitter layers being an n-type material and the other being a p-type material). The p-n junction facilitates the generation of an electric current in response to light incident on the solar cell.

A surface field layer (e.g. front or back surface field layer), is arranged on an opposite surface of the substrate to the emitter layer. The surface field layer is doped (i.e. with the opposite charge type to the emitter) and is configured to extract charge carriers from the substrate.

The emitter and surface field layers are typically formed of amorphous silicon (a-Si) whereas the substrate is formed of crystalline silicon (c-Si) so as to convey a heterojunction technology type (HJT) solar cell.

With such HJT solar cells, a transparent conducting oxide layer (TCO) is interposed between the surface field layer and one of the electrodes, and a further TCO layer is interposed between the emitter layer and the other of the electrodes. The TCO layers are arranged to extract charge carriers from the active layers (e.g. the surface field and emitter layers) of the solar cell and transport them to the respective electrodes.

To maximise the efficiency of solar cell, it is important to maximise the optoelectronic properties of the TCO layers. However, since transparent materials are generally insulators, and conductive materials tend to have metallic properties, there is a fundamental trade-off between the optical and electrical properties of such materials.

Accordingly, there is still a need to increase the optical properties of the TCO layers of such solar cells, whilst also improving their charge carrier transport properties.

SUMMARY

According to a first aspect there is provided a solar cell comprising a substrate (e.g. a crystalline silicon substrate), a semiconductor layer arranged on a back surface of the substrate which is configured not to face a radiative source (or is configured to face away from a radiative source), when the solar cell is in use, and a transparent-conductive region being arranged on a surface of the semiconductor layer. The transparent conductive region comprises a first layer having a first work function and a second layer having a second work function and being interposed between the first layer and the semiconductor layer. The second work function of the second layer is greater than the first work function of the first layer. In an embodiment, the semiconductor layer is interposed between the substrate and the transparent-conductive region.

During the operation of a known solar cell, photo-generated carriers are collected by the TCO and transported to an electrode. Such a TCO layer may be configured with a low work function which increases its conductivity so as to increase the transportation of photo-generated carriers to the electrode. However, the low work function of the TCO layer can lead to an increase in the contact resistance with a semiconductor layer (e.g. amorphous silicon, a-Si) of the solar cell, upon which the TCO layer is arranged.

The increased contact resistance results from the formation of a potential barrier (e.g. a parasitic Schottky barrier) at the interface between the TCO and the semiconductor layer. This potential barrier generates a diffusion potential which hinders the collection of photo-generated carriers by the TCO layer, and thereby decreases the efficiency of the solar cell.

The transparent-conductive region of the present invention is provided with a second layer which is arranged between the first layer and semiconductor layer. The second layer is configured with a work function which is greater than the work function of the first layer. As such, the second work function of the second layer is more suitably matched to the valence band, or conduction band, of the semiconductor layer so as to reduce the parasitic potential barrier. As such, the transparent-conductive region is able to extract more photo-generated carriers from the semiconductor layer, which thereby increases the fill factor (FF) and efficiency of the solar cell.

Furthermore, the first layer of the transparent-conductive region is configured with a smaller work function which results in lower transparency (compared with the second layer). This leads to increased reflectance of unabsorbed photons back towards the photo-active layers of the solar cell (e.g. the semiconductor layer).

The relatively low work function of the first layer also leads to increased electrical conductivity (compared with the second layer), which thereby promotes the transfer of photo-generated charge carriers into an electrode, which may be arranged on an exterior (e.g. outermost) surface of the transparent-conductive region.

It will be appreciated that the term 'work function' refers to the difference in energy level between the Fermi level of a solid material and the energy of free space outside the solid material, i.e. the vacuum level. As such, this term defines the minimum energy required to liberate an electron from the solid material at absolute zero temperature.

The work function of a material is considered to be greater than that of another material when its corresponding energy value (as measured in electron volts, eV) is larger than that of the other material.

The semiconductor layer is arranged on a back surface of the substrate which is configured not to face a radiative source, when the solar cell is in use. In this way, the transparent-conductive region is arranged on a back surface of the semiconductor layer. The first layer of the transparent-conductive region, which defines the outermost layer, has a smaller work function and, therefore, a lower transparency (i.e. high reflectance). Accordingly, the first layer may be configured to reflect photons which may have passed through to the transparent-conductive region back towards the photo-active layers of the solar cell. Furthermore, the increased conductivity of the first layer will reduce the contact resistance with a back electrode which may be arranged on its outer surface.

It will be understood that when an element such as a layer, film, region, or substrate is referred to as being "on", "adjacent" or "opposite" to an element, it can be "directly on", "directly adjacent" or "directly opposite" to that further element; alternatively, there may be one or more intervening elements present. In contrast, when an element is referred to as being "directly on", "directly adjacent" or "directly opposite" another element, there are no intervening elements present.

Optional features will now be set out. These are applicable singly or in any combination with any aspect.

The semiconductor layer may be configured with a positive conductivity type (i.e. p-type). In this case, the second layer of the transparent-conductive region having a greater work function provides a closer match to the valence band of the p-type semiconductor layer which aids in the transport of positive charge carriers (i.e. holes) across the interface between the transparent-conductive region and the semiconductor layer. In particular, the greater work function of the second layer prevents band bending at the interface with the p-type semiconductor which would otherwise present a potential barrier (e.g. a Schottky barrier) to the holes which are driven towards the electrodes when the solar cell is in use. In this way, second layer of the transparent-conductive region increases the extraction of holes from the solar cell despite having a smaller conductivity than the first layer.

The second work function of the second layer may be configured to be less than the work function of the semiconductor layer. The phrase 'less than' may define a second work function which is 'only slightly less than' the work function of the semiconductor layer. As such, the second work function may be configured to be less than, but substantially close to (i.e. so as to be matched with), the semiconductor layer work function in order to facilitate the efficient transfer of charge carriers across the interface between these two layers. In an exemplary arrangement, the second work function may be less than 5% of the semiconductor layer work function, optionally less than 2%, or optionally less than 1%.

The difference between the work function of the semiconductor layer and the work function of the second layer of the transparent-conductive region may be less than the difference between the work function of the semiconductor layer and the work function of the first layer of the transparent-conductive region.

Advantageously, the work function of the second layer is more closely matched with the work function of the semiconductor layer. In this way, the second layer is able to provide improved band alignment between the semiconductor layer and the transparent-conductive region, compared with the first layer, which thereby reduces the contact resistance at the interface between the transparent-conductive region and the semiconductor layer.

The transparent-conductive region may be defined as a degenerated semiconductor (i.e. a heavily doped semiconductor) in which the Fermi level is located in the conduction band causing the material to behave as a metal. Changes in the carrier doping concentration in the layers of the transparent-conductive region can shift the work function (and also the Femi level) which thereby affects the band alignment at the interface between the transparent-conductive region and the semiconductor layer.

The work function of the transparent-conductive region depends on the material properties of the transparent-conductive region material, which can be determined by controlling the parameters of the transparent-conductive region fabrication process (e.g. deposition). In particular, the work function of the transparent-conductive region may be modified by controlling the oxygen concentration during the fabrication of the transparent-conductive region layer.

At least one or each of the layers of the transparent-conductive region may be configured with a work function of between 3.5 eV and 6.0 eV, optionally between 4.0 to 5.5 eV The third layer may be directly arranged on the semiconductor layer. For example, the third layer may be arranged in direct contact with (e.g., deposited on) a surface (e.g., a receiving surface) of the semiconductor layer. In this way, the third layer is advantageously configured to extract charge carriers directly from the semiconductor layer.

The first layer may be arranged directly on the second layer. For example, the first layer may be arranged in direct contact with (e.g., deposited on) a surface (e.g., a receiving surface) of the second layer. Furthermore, the second layer may be arranged directly on the third layer. In this way, there may be a defined step change in the work functions at the interfaces between these respective layers of the transparent-conductive region.

The third work function of the third layer may be configured to be up to 10% greater than the second work function of the second layer (e.g. up to 110% of the second work function). Alternatively, the third work function of the third layer may be configured to be up to 15% greater than the second work function of the second layer (e.g. up to 115% of the second work function). Alternatively, the third work function of the third layer may be 20 configured to be at least 10% and up to 15% greater than the second work function of the second layer (e.g. at least 110% and up to 115% of the second work function).

When the third layer is arranged directly adjacent to the semiconductor layer, the third work function of the third layer may be configured to be greater than 5.0 eV and less than 6.0 eV, optionally 5.5 eV. In this case, the work function of the second layer may be less than the work function of the third layer (e.g. less than between 5.0 eV and 6.0 eV) and greater than the work function of the first layer (e.g. greater than between 3.5 eV and 4.5 eV).

At least one of the layers of the transparent-conductive region may be formed of a metal oxide material. At least one of the layers of the transparent-conductive region may be formed of indium tin oxide (ITO). Alternatively, at least one layer of the transparent-conductive region may be formed of one or more of: zinc oxide (ZnO), indium doped tin oxide (ITO), tin oxide (SnO2), indium oxide (In2O3) and fluoride doped tin oxide (FTO). The semiconductor layer may be formed of amorphous silicon (a-Si).

The surface of the substrate on which the semiconductor layer is arranged may be a first surface of the substrate, and the solar cell may comprise a second semiconductor layer arranged on a second surface of the substrate which is opposite the first surface. The solar cell may further comprise a second transparent-conductive region being arranged on a surface of the second semiconductor layer.

The second transparent-conductive region may comprise a first layer having a first work function; and a second layer having a second work function and being interposed between the first layer and the second semiconductor layer. The second work function of the second layer may be configured to be greater than the first work function of the first layer.

The second semiconductor layer may be configured with a negative conductivity type (i.e., n-type).

The second transparent-conductive region may comprise a third layer being interposed between the second layer and the second semiconductor layer. The third layer may be arranged directly on the second semiconductor layer. For example, the third layer of the second transparent-conductive region may be arranged in direct contact with (e.g., deposited on) a surface (e.g., a receiving surface) of the second semiconductor layer. Accordingly, the third layer is advantageously configured to extract charge carriers directly from the second semiconductor layer. The third layer may be configured with a third work function which may be greater than the second work function of the second layer.

The second semiconductor layer may define an emitter layer. The emitter layer may be arranged on a front surface of the substrate which may be configured to face a radiative source, when the solar cell is in use.

At least one of the layers of the second transparent-conductive region may be formed of a metal oxide material, and the second semiconductor layer may be comprised of amorphous silicon (a-Si).

The work functions of the first and second layers of the second transparent-conductive region may be configured in a similar manner as the corresponding layers of the first transparent-conductive region. However, in this case, the difference between the work functions of the transparent-conductive layers will be smaller to reflect the smaller difference in work function between the front electrode and the front side accumulator layer.

The substrate may be comprised of crystalline silicon (c-Si), e.g., a silicon wafer. The crystalline silicon substrate may comprise a continuous crystal structure, e.g. monocrystalline silicon. Alternatively, the substrate may comprise one or more grains of a continuous crystal structure, e.g. polycrystalline (or multi-crystalline) silicon.

Each of first and second layers of the transparent-conductive region may be configured with a width, a length and a depth. Each such layer may be configured such that its width and length are both substantially greater than its depth. The width and length of the layers may be measured in perpendicular directions aligned with the plane of the surface of the substrate, and the depth may be measured in a direction which is perpendicular to the plane of the surface of the substrate.

The transparent-conductive region may have a thickness of less than 500 nm, optionally less than 200 nm, optionally less than 100 nm. Each of the layers of the transparent-conductive region may have a thickness of at least 20 nm and no more than 50 nm.

The front transparent-conductive region may be further configured to define an anti-reflection layer, or coating, of the solar cell. As such, the layers of the transparent-conductive region may be textured to provide an anti-reflective surface. The anti-reflection layer advantageously reduces the reflectance of light incident on the solar cell and increases selectivity of a predetermined wavelength band, thereby increasing the efficiency of the solar cell.

According to an exemplary arrangement, the solar cell may comprise an electrode which is arranged on a surface of the transparent-conductive region opposite from a surface which forms an interface with the semiconductor layer (e.g. such that the transparent-conductive region may be interposed between the substrate and the electrode).

The solar cell may further comprise a passivation layer which may be arranged between the substrate and at least one or each of the first and second semiconductor layers. The passivation layer(s) may be formed of amorphous material which may be configured to passivate the substrate surface(s) upon which the respective semiconductor layers are arranged. The passivation layer(s) may be comprised of amorphous silicon (a-Si). The passivation layer(s) may be non-doped (e.g., formed of an intrinsic semiconductor material).

At least one or each of the semiconductor layers and/or the passivation layer(s) may be comprised of a material having a prescribed chemical composition. Each one of the layers may be deposited (or e.g. diffused or implanted) on to the substrate in a sequential process.

It will be understood from the foregoing that both the substrate and the semiconductor layers may be formed from one or more semiconductor materials. Each of the semiconductor materials may be configured with a conductivity type which is determined by the inclusion of dopant atoms. In this way, each of the respective semiconductor materials may be doped with atoms having a determined charge, in order to increase the excess charge carriers within the doped bulk material.

It will be understood that the ionisation state of the dopant atoms may determine the conductivity type of the doped semiconductor material. For example, the semiconductor materials may be positively or negatively doped so as to exhibit a positive conductivity type (p-type) or a negative conductivity (n-type), respectively. Any layer having a determined conductivity type (e.g. p-type or n-type) may be configured to create an electrostatic driving force that drives photogenerated charge carriers (e.g. electrons and holes) towards that layer. For example, a p-type material will attract electrons and repel holes, and an n-type material will attract holes and repel electrons. In some cases, the semiconductor material may not be doped (e.g. such as with the intrinsic passivation layer).

The substrate may be configured with a first conductivity type (for example, n-type) and the semiconductor layer may be configured with a second conductivity type (for example, a p-type) opposite the first conductivity type, and thus forms a p-n junction along with the substrate.

The interface formed between the p-type and n-type materials at the p-n junction causes excess electrons and holes to diffuse to the n-type and p-type materials, respectively. This relative movement of the charge carriers results in the formation a depletion region (e.g. a space charge region) at the p-n junction. A built-in potential difference is formed across the depletion region once a thermal equilibrium condition is reached.

During operation of the solar cell, a plurality of electron-hole pairs produced by light incident on the substrate is separated into electrons and holes by the electric filed created by the built-in potential difference resulting from the p-n junction. Then, the separated electrons move (e.g. tunnel) to the n-type semiconductor, and the separated holes move to the p-type semiconductor. Thus, when the substrate is n-type and the emitter is p-type, the separated holes and electrons move to the emitter and the substrate, respectively. In particular, the holes and electrons move to the respective electrodes arranged on the emitter and substrate side of the p-n junction. Accordingly, the electrons become majority carriers in the substrate, and the holes become majority carriers in the emitter.

According to an exemplary arrangement, the substrate may be formed from an n-type monocrystalline silicon wafer. At least one of the semiconductor layers (e.g. the first semiconductor layer) may comprise an amorphous material which is at least partially doped so as to be p-type. Such an arrangement may contribute towards the formation of a heterojunction technology (HJT) type solar cell, which is so defined because it combines two different materials to create a charge separating field at the p-n junction. Alternatively, it will be appreciated that the solar cell may be configured to define any type of solar cell structure. For example, the substrate and emitter may define a tandem junction solar cell.

When the semiconductor material is n-type, it may be configured to contain impurities of a group V element such as phosphor (P), arsenic (As), and antimony (Sb). When the semiconductor material is p-type, it may contain impurities of a group III element such as boron (B), gallium (Ga), and indium (In). The passivation layer may be configured with no conductivity type such that it forms an intrinsic layer between the emitter and the substrate.

According to an alternative arrangement, the emitter may be n-type and the substrate may be p-type so as to form a p-n junction therebetween. In this instance, the separated holes and electrons move towards the substrate and the emitter, respectively. In particular, the holes and electrons move to the respective electrodes arranged on the substrate and emitter side of the p-n junction.

The other of the at least one semiconductor layers (e.g. the second semiconductor layer) may be configured with the first conductivity type (e.g. n-type), which is the same as that of the substrate. This semiconductor layer may define an accumulator, of the solar cell, which is configured to selectively screen, or extract, charge carriers from the substrate.

In embodiments, the substrate may be formed of a p-type monocrystalline silicon wafer and the semiconductor layer may comprise an amorphous material which is at least partially doped so as to be p-type.

As well as being configured with a determined conductivity type, each one of the semiconductor layers may be configured with a different dopant concentration. Each of the doped layers may be configured to create an electrostatic driving force that drives photogenerated charge carriers (e.g. electrons and holes) towards the respective layers. The doping concentration of at least one of the doped layers may be increased so as to create a stronger electrostatic force leading to increased charge transport moving away from the substrate.

According to an exemplary arrangement, the solar cell may comprise a crystalline silicon substrate; a back semiconductor layer arranged on a back surface of the substrate which is configured not to face a radiative source, when the solar cell is in use; a front semiconductor layer arranged on a front surface of the substrate which is configured to face a radiative source, when the solar cell is in use; a back transparent-conductive region arranged on a surface of the back semiconductor layer; and a front transparent-conductive region arranged on a surface of the front semiconductor layer; wherein the back transparent conductive region comprises; a first layer having a first work function; and a second layer having a second work function and being interposed between the first layer and the back semiconductor layer, wherein the second work function of the second layer is greater than the first work function of the first layer; and wherein the front transparent-conductive region comprises; a first layer having a first work function; and a second layer having a second work function and being interposed between the first layer and the front semiconductor layer, wherein the second work function of the second layer is greater than the first work function of the first layer; wherein at least one of the back and front transparent conductive regions comprises a third layer having a third work function and being interposed between the substrate and the respective second layer of the at least one back and front transparent conductive regions, wherein the third work function of the third layer is greater than the second work function of the respective second layer of the at least one back and front transparent conductive regions. According to the advantageous arrangement, each of the front and back transparent-conductive regions has at least two layers which are configured so that the work function of the respective regions increases towards the substrate. Also, at least one of the front and back transparent-conductive regions includes a third layer which is configured so that the work function increases progressively (e.g., incrementally) towards the substrate (e.g., across all three layers). By configuring at least one of the front and back transparent-conductive regions with a progressively increasing work function towards the substrate (e.g., across three distinct layers), this optimises the charge extraction at the front and rear electrodes whilst increasing the transmission of photons into the substrate.

The front transparent-conductive region may be configured with only two layers (e.g., the first and second layers) whereas the back transparent-conductive region may be configured with three layers (e.g., the first, second and third layers). Alternatively, the back transparent-conductive region may be configured with only two layers and the front transparent-conductive region may be configured with three layers.

Each of the front and back transparent-conductive regions may comprise a third layer having a third work function and being interposed between the substrate and the respective second layers of the front and back transparent conductive regions (e.g., the front transparent-conductive region may comprise a third front layer arranged between the substrate and the second front layer, and the back transparent-conductive region may comprise a third back layer arranged between the substrate and the second back layer). The third work function of each of the third layers may be greater than the second work function of the respective second layers of the front and back transparent conductive regions (e.g., the work function of the third front layer may be greater than the work function of the second front layer, and the work function of the third back layer may be greater than the work function of the second back layer).

As described above, the solar cell may comprise an electrode arranged opposite the transparent-conductive region and configured to extract photo-generated charge carriers from the solar cell. The electrode may be arranged such that the transparent-conductive region is interposed between the electrode and the substrate.

When the transparent-conductive region is arranged on a back (e.g. backmost) surface of the substrate, the electrode may be arranged on a back surface of the transparent-conductive region, to define a back electrode of the solar cell.

When the transparent-conductive region is arranged on a front (e.g. frontmost) surface of the substrate, the electrode may be arranged on a front surface of the transparent-conductive region, to define a front electrode of the solar cell.

When the solar cell comprises a front transparent-conductive region and a back transparent-conductive region arranged on a front and back surface of the substrate, respectively, the solar cell may comprise a front electrode arranged on the front surface of the front transparent-conductive region and back electrode arranged on the back surface of the back transparent-conductive region. Each electrode may be configured to form an ohmic contact with the respective surfaces of the front and back transparent-conductive region.

The front and back electrodes may each comprise a plurality of finger electrodes which are arranged on the respective surfaces of the transparent-conductive region. Each finger electrode may be configured with an axial length which is substantially greater than its width. Both the width and axial length of the finger electrode may be measured in perpendicular directions in the plane of the respective surface of the transparent-conductive region. The finger electrodes may extend in a transverse direction which is parallel with the width direction of the transparent-conductive region.

The finger electrodes within each of the pluralities of front and/or back finger electrodes may be spaced apart across the respective surfaces to define transversely-extending spaces between the finger electrodes. The finger electrodes may be spaced apart in a longitudinal direction which is substantially parallel with the length direction of the transparent-conductive region. The finger electrodes in each plurality may be substantially parallel to one another. Accordingly, the plurality of back finger electrodes may form an array of parallel, longitudinally spaced (e.g. equally spaced) finger electrodes.

It will be understood that the terms 'conductive' and 'insulating' as used herein, are expressly intended to mean electrically conductive and electrically insulating, respectively. The meaning of these terms will be particularly apparent in view of the technical context of the disclosure, being that of photovoltaic solar cell devices. It will also be understood that the term 'ohmic contact' is intended to mean a non-rectifying electrical junction (i.e. a junction between two conductors which exhibits a substantially linear current-voltage (I-V) characteristic).

According to an exemplary arrangement, the solar cell may comprise a substrate (e.g., a silicon substrate), a front semiconductor layer arranged on a front surface of the substrate, a front transparent-conductive region arranged on a front surface of the front semiconductor layer, a back semiconductor layer arranged on a back surface of the substrate and a back transparent-conductive region arranged on a back surface of the back semiconductor layer.

The back semiconductor layer may define an emitter of the solar cell, being positioned opposite the substrate to form a p-n junction. The emitter may be electrically connected to a back electrode and arranged such that the emitter is arranged between the back electrode and the substrate. The back transparent-conductive region may be configured to extract charge carriers from the emitter and transfer them to the back electrode during operation of the solar cell The front semiconductor layer may define an accumulator being positioned toward the front surface of the substrate, i.e. between the substrate layer and a front electrode. The front transparent-conductive region may be configured to extract charge carriers from the accumulator and transfer them to the front electrode during operation of the solar cell.

According to an exemplary arrangement, the solar cell may include an n-type silicon substrate, a p-type rear emitter and at least two transparent-conductive layers having different work functions, wherein the transparent-conductive layer which is arranged closest to the emitter layer has a greater work function than the other of the two transparent-conductive layers.

It will be appreciated that the above arrangement of transparent-conductive layers would also be applicable to a p-type emitter layer arranged on a front surface of the n-type silicon substrate.

Alternatively, the above arrangement of transparent-conductive layers would be further applicable to a solar cell having a p-type silicon substrate and a p-type accumulator layer arranged on the front side of the substrate. However, in this arrangement, the difference between the work function of the transparent-conductive layers may be smaller due to the smaller difference in work function between the front electrode and the p-type accumulator layer.

According to a second aspect there is provided a solar module comprising a plurality of solar cells according to the first aspect. The plurality of solar cells may be electrically coupled together.

According to a third aspect there is provided a method for manufacturing a solar cell comprising the steps of providing a substrate (e.g. a crystalline silicon substrate), arranging a semiconductor layer on a surface of the substrate and arranging a transparent-conductive region on the semiconductor layer, the transparent-conductive region comprising a first layer and a second layer. The step of arranging the transparent-conductive region comprises arranging the second layer on the semiconductor layer and arranging the first layer on the second layer such that the second layer is interposed between the first layer and the semiconductor layer. The method comprises configuring the first layer with a first work function, and configuring the second layer with a second work function which is greater than the first work function of the first layer.

The method of arranging the semiconductor layer on the surface of the substrate may comprise configuring the semiconductor layer with a positive conductivity type (i.e. p-type).

The transparent-conductive region may comprise a third layer being interposed between the second layer and the semiconductor layer. In this case, the method of arranging the transparent-conductive region may comprise, prior to depositing the second layer, arranging the third layer on the semiconductor layer. This method may comprise configuring the third layer with a third work function which is greater than the second work function of the second layer. The step of arranging the third layer may comprise arranging directly the third layer on the semiconductor layer (e.g., depositing the third layer directly onto a surface (e.g., a receiving surface) of the semiconductor layer).

The step of arranging the transparent-conductive region may comprise sequentially depositing the layers of the transparent-conductive region onto the semiconductor using a sputtering process or any other suitable deposition method. The sputtering process may comprise direct current (DC) magnetron sputtering.

The method may comprise controlling at least one parameter of the sputtering process to determine the work function in the first and second layers. The at least one parameter may comprise at least one of gas composition and gas flow-rate.

Alternatively, the method may comprise altering the TCO deposition method to deposit a different material for the first and second layers. The different TCO materials of the first and second layers may comprise at least one of zinc oxide (ZnO), indium doped tin oxide (ITO), tin oxide (SnO2), indium oxide (In2O3) and fluoride doped tin oxide (FTO).

The method may comprise configuring the sputtering process of the first layer with a first oxygen flow rate and configuring the sputtering process of the second layer with a second oxygen flow rate which is greater than the first oxygen flow rate. The method may comprise configuring the sputtering process of the third layer with a third oxygen flow rate which is greater than the second oxygen flow rate of the second layer. Advantageously, the increasing oxygen flow rate results in a greater work function of the transparent conductive material of the corresponding layer.

The method may comprise arranging the semiconductor layer and the transparent-conductive region on a back surface of the substrate which is configured not to face a radiative source, when the solar cell is in use.

The surface of the substrate on which the semiconductor layer is arranged may be a first surface of the substrate, and the method may comprise arranging a second semiconductor layer on a second surface of the substrate, the second surface being opposite the first surface, and arranging a second transparent-conductive region on a surface of the second semiconductor layer, the second transparent-conductive region comprising a first layer and a second layer. The step of arranging the second transparent-conductive region may comprise arranging the second layer on the second semiconductor layer and arranging the first layer on the second layer such that the second layer is interposed between the first layer and the second semiconductor layer. The method may comprise configuring the first layer with a first work function, and configuring the second layer with a second work function which is greater than the first work function of the first layer.

The second transparent-conductive region may comprise a third layer being interposed between the second layer and the second semiconductor layer. In this case, the method of arranging the second transparent-conductive region may comprise, prior to depositing the second layer, arranging the third layer on the second semiconductor layer. This method may comprise configuring the third layer with a third work function which is greater than the second work function of the second layer. The step of arranging the third layer of the second transparent-conductive region may comprise arranging directly the third layer on the second semiconductor layer (e.g., depositing the third layer directly onto a surface (e.g., a receiving surface) of the second semiconductor layer).

The method may comprise arranging the second semiconductor layer and the second transparent-conductive region on a front surface of the substrate which is configured to face a radiative source, when the solar cell is in use.

The method of arranging the transparent-conductive region may comprise configuring at least one or each of the layers of the transparent-conductive region such that they form an anti-reflection layer, or coating, of the solar cell.

The method of arranging the second semiconductor layer on the second surface of the substrate may comprise configuring the second semiconductor layer with a negative conductivity type (i.e. n-type).

The method may comprise, prior to arranging at least one or each of the first and second semiconductor layers, arranging a passivation layer on the surface of the substrate such that it is interposed between the respective semiconductor layer and the substrate. The passivation layer(s) may be formed of an amorphous material. The method may comprise configuring the passivation layer(s) such that it is substantially undoped (i.e. intrinsic).

The step of arranging at least one or each of the first and second semiconductor layers and/or the passivation layer may comprise depositing the layers onto the substrate using a vapour deposition process. The vapour deposition process may be a plasma enhanced chemical vapour deposition process (PECVD).

The method may comprise controlling at least one parameter of the vapour deposition process to determine the structural, chemical and dopant composition of at least one of the first and second semiconductor layers and/or the passivation layers. The vapour deposition process parameter may comprise a gas composition and/or a gas flow-rate. The vapour deposition process parameter may define a temperature of the deposition chamber. The gas composition may comprise at least one of carbon dioxide ($CO_2$), silane ($SiH_4$) and hydrogen ($H_2$).

The method may further comprise arranging an electrode on at least one or each of the first and second transparent-conductive regions.

Each transparent-conductive region may comprise a back (e.g. backmost) surface and a front (e.g. frontmost) surface being opposite the back surface. Accordingly, when the transparent-conductive region is arranged on the back surface of the substrate, the method may comprise arranging an electrode onto the back surface of the transparent-conductive region to define a back electrode. When the transparent-conductive region is arranged on the front surface of the substrate, the method may comprise arranging an electrode onto the front surface of the transparent-conductive region to define a front electrode.

The electrode may comprise a plurality of finger electrodes and so the method may comprise depositing a plurality of finger electrodes onto the first layer. The method may comprise depositing an electrically conductive material onto a front or back surface of the transparent-conductive region.

The electrically conductive material may be deposited by various methods including evaporation, plating, printing etc. For example, the electrically conductive material may comprise a printed material. The method of depositing the electrically conductive material may comprise printing a printable precursor of the printed material onto the surface of the transparent-conductive region. The method may further comprise curing the printable precursor according to a firing process to form the finger electrodes.

The skilled person will appreciate that except where mutually exclusive, a feature or parameter described in relation to any one of the above aspects may be applied to any other aspect. Furthermore, except where mutually exclusive, any feature or parameter described herein may be applied to any aspect and/or combined with any other feature or parameter described herein.

BRIEF DESCRIPTION OF THE DRAWINGS

Embodiments will now be described by way of example only, with reference to the Figures, in which.

DETAILED DESCRIPTION

Aspects and embodiments of the present disclosure will now be discussed with reference to the accompanying figures. Further aspects and embodiments will be apparent to those skilled in the art.

Figure 1:
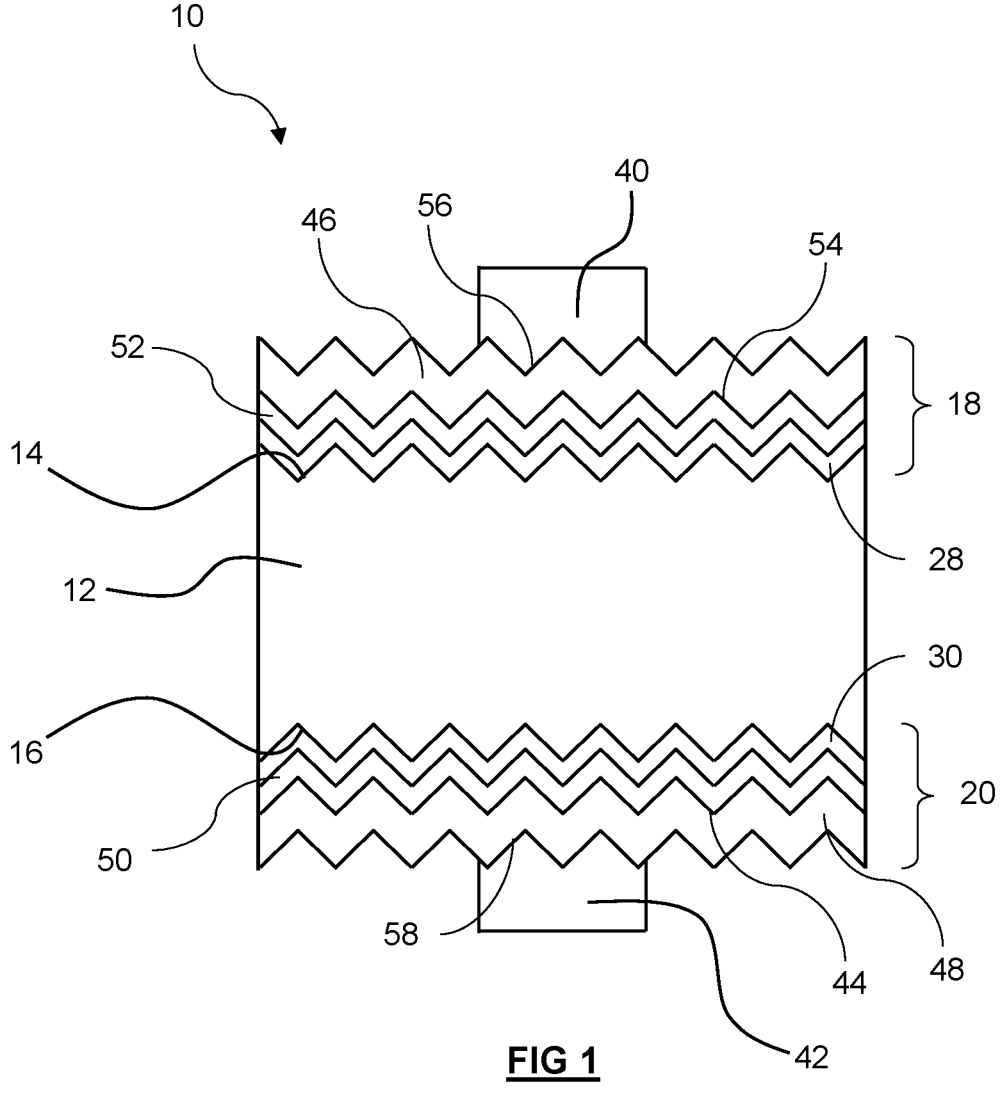
FIG. 1 is a schematic illustrating the layers of a solar cell.

FIG. 1 schematically illustrates a solar cell 10 comprising, among other layers, a semiconductor substrate 12 comprising a first (i.e. front) surface 14, upon which light from a radiative source (e.g. the sun) is incident during normal use, and a second (i.e. back) surface 16 that is opposite the front surface 14. That is, the front surface 14 may be configured in use to face the sun, whereas the back surface 16 may be configured in use to face away from the sun.

The substrate 12 divides the solar cell 10 into a front portion 18 that is forward (i.e. in front of) of the substrate 12, and a back portion 20 that is rearward of the substrate 12. Light incident on the solar cell 10 passes through the front portion 18, the substrate 12 and then the back portion 20.

Each of the front and back portions 18, 20 comprises a plurality of layers which are arranged to define separate layered structures. The front portion 18 (also referred to herein as a front layered structure 18) is arranged opposite the front surface 14 of the substrate 12 and the back portion 20 (also referred to herein as a back layered structure 20) is arranged opposite the back surface 16 of the substrate 12. The constituent layers of the front and back layered structures 18, 20 are sequentially deposited (or e.g. diffused or implanted) onto the respective front and back surfaces 14, 16 of the substrate 12.

Each of the layers of the front and back portions 18, 20 are configured with a width, a length and a depth. The width and length of each layer is measured in perpendicular directions that are aligned with the front and back surfaces 14, 16 of the substrate 12. For each layer, its width and length is substantially greater than its depth, which is measured in a direction that is perpendicular to the front and back surfaces 14, 16 of the substrate 12.

The solar cell 10 is a back emitter solar cell (and, in particular, a back emitter heterojunction solar cell 10). As such the solar cell 10 is provided with an emitter 50 and an accumulator 52 arranged either side of the substrate 12. Accordingly, the emitter 50 forms part of the back portion 20 and the accumulator 52 forms part of the front portion 18.

According to the illustrated embodiment, the substrate 12 is an n-type monocrystalline silicon wafer which forms a p-n junction with the p-type emitter layer 50. The accumulator layer 52 is configured to have n-type such that it can extract electrons from the substrate 12. The emitter and accumulator layers 50, 52 are each formed of a doped amorphous silicon (a-Si) material, which is doped with corresponding elements in order to achieve the prescribed conductivity type, as would be understood by the skilled person.

The front portion 18 comprises a front passivation layer 28 which is interposed between the front surface 14 of the substrate 12 and the accumulator 52. A back passivation layer 30, of the back portion 20, is interposed between emitter 50 and the back surface 16 of the substrate 12. Each of the passivation layers 28, 30 are formed of intrinsic amorphous silicon material, as would be understood by the skilled person.

The emitter and accumulator layers 50, 52 each have a depth of 12 nm and the passivation layers 28, 30 each have a depth of 3 nm (as measured in the vertical direction shown in FIG. 1).

The solar cell 10 is further provided with a transparent-conductive (TC) region 46, (also referred to herein as a front TC region 46), which is arranged at a front surface 54 of the accumulator 52. A further TC region 48 (also referred to herein as a back TC region 48) is arranged at a back surface 44 of the emitter 50.

Figure 2:
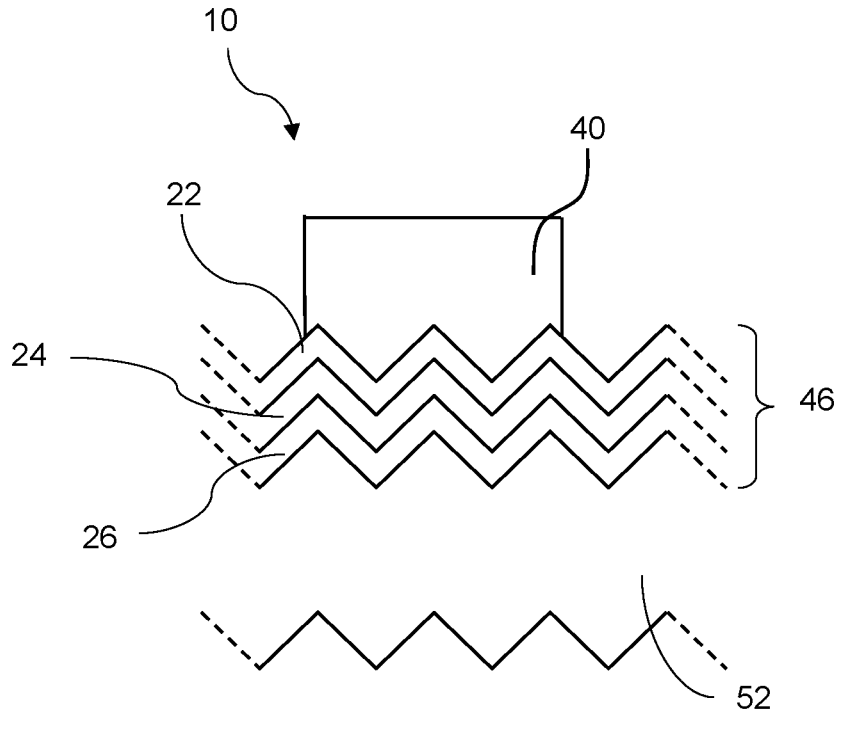
FIG. 2 is a close-up view of a front transparent-conductive region of the solar cell of FIG. 1.
Figure 3:
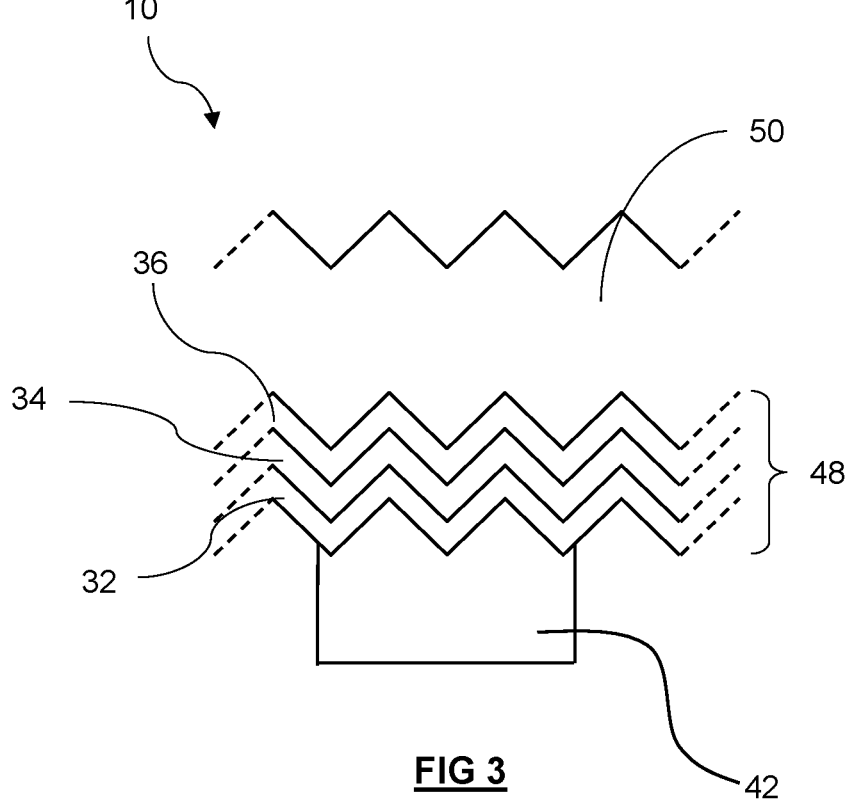
FIG. 3 is a close-up view of a back transparent-conductive region of the solar cell of FIG. 1.

The TC regions 46, 48 are each textured to provide an anti-reflective surface of the solar cell 10, as shown in FIGS. 1 to 3. A front electrode 40 is provided at a front textured surface 56 of the front TC region 46 and a back electrode 42 is provided at a back textured surface 58 of the back TC region 48. The front and back electrodes 40, 42 are formed of silver.

The front and back TCO regions 46, 48 each have a thickness of less than 100 nm (as measured in the vertical direction shown in FIG. 1), and they are each formed of indium tin oxide (ITO). However, the composition of each of the TC regions 46, 48 is varied across its depth, as will be described in more detail below.

The front and back TC regions 46, 48 will now be described in more detail with reference to FIGS. 2 and 3, respectively.

The front TC region 46 comprises first, second and third front layers 22, 24, 26, which all have different compositions. The third front layer 26 is interposed between the accumulator 52 and the second front layer 24, and the second front layer 24 is interposed between the third front layer 26 and the first front layer 22, as shown in FIG. 2.

Each of the first, second and third front layers 22, 24, 26 is configured with a different work function. In particular, the first front layer 22 is configured with a first work function which is smaller than a second work function of the second front layer 24, which is smaller than a third work function of the third front layer 26.

The work function of each layer of the TC regions 46, 48 refers to the difference in energy between the Fermi level of the constituent material of that layer and the energy of free space outside of the material. The work function of a particular layer is described as being greater than that of another layer when its work function energy value (as measured in electron volts, eV) is greater than the work function energy value of the layer against which it is being compared. Furthermore, since the work function of a material is measured on a negative scale, the term greater refers to a work function value which is more negative than the comparative value.

The first work function of the first front layer 22 is approximately 4.0 eV, the second work function of the second front layer 24 is approximately 4.1 eV, and the third work function of the third front layer 26 is approximately 4.2 eV. The work function of the accumulator layer 52 is approximately 4.2 eV and the work function of the front electrode 40 is approximately 4.0 eV.

The front TC region 46 is formed of a stack of transparent-conductive layers having a stepwise increase in work function when moving towards the active layers of the solar cell 10 (the vertically downward direction as shown in FIG. 2). In this way, the third front layer 26 is configured with the highest (e.g. greatest) work function (i.e., of the three layers) such that it has lower conductivity than the first and second layers 22, 24. However, this means the third front layer 26 provides an advantageously transparent window through to the accumulator layer 52 arranged immediately beneath the front TC region 46.

Furthermore, the first front layer 22 is configured with the lowest (e.g. smallest) work function, such that it has greater conductivity than the second and third layers 24, 26. This means the first front layer 22 provides a good electrical contact with front electrode 40. The lower work function also decreases the transparency of the front TC region 46 at the uppermost surface of the solar cell 10. To accommodate for the reduction in transparency, the thickness of first front layer 22 is made as thin as possible in order to increase the number of incident photons that pass through to the photo-active layers.

Finally, the second front layer 24 is configured with an intermediate work function which is chosen so as to provide a balance between the conductivity and transparency of the first and third layers, which the second layer is interposed between. As such, the second front layer 24 provides a bridge in electro-optical properties between the first and third front layers 22, 26.

Similar to the front TC region 46, the back TC region 48 also includes a stack of three back layers 32, 34, 36 as shown in FIG. 3. As with the front layers, each of the first, second and third back layers 32, 34, 36 are formed of indium tin oxide. However, in contrast to the front layers, the three back layers 32, 34, 36 are formed of different material compositions such that their work functions exhibit a stepwise increase when moving towards the active layers of the solar cell 10 (the vertically upward direction as shown in FIG. 3).

In particular, the first back layer 32 has a first work function which is smaller than that of the second and third layers 34, 36. The second back layer 34 has a second work function which is smaller than that of the third layer 36, but greater than that of the first back layer 32. The third back layer 32 has a third work function which is greater than that of both the first and second back layers 32, 34.

The first work function of the first back layer 32 is approximately 4.0 eV, the second work function of the second back layer 34 is approximately 4.75 eV, and the third work function of the third back layer 36 is approximately 5.5 eV. The work function of the emitter layer 50 is approximately 5.5 eV and the work function of the back electrode 42 is approximately 4.0 eV.

According to the illustrated embodiment, the work function of the third layer 36 is more suitably matched to the valence band of the emitter 50, which reduces the possibility of a parasitic potential barrier being formed between the TC region 48 and the emitter 50.

In addition, the first back layer 32 is configured with a relatively low work function such that it has a lower transparency, which increases the reflectance of the TC region 48 at the rearmost surface of the solar cell 10. As a result, more unabsorbed photons may be reflected back towards the photo-active layers of the solar cell 10 by the first back layer 32 of the back TC region 48 when in use.

It will be appreciated that the first back layer 32 is arranged adjacent to the back electrode 42 of the solar cell 10, and since the first back layer 32 has a relatively low work function it also exhibits increased electrical conductivity (compared with the second and third back layers 34, 36). The relatively high conductivity of the first back layer 32 causes an increase in the transfer of photo-generated charge carriers (i.e. holes) into the back electrode 42. Accordingly, the back TC region 48 is able to extract more photo-generated carriers from the emitter 50, which thereby increases the fill factor (FF) of the solar cell 10.

Each of the first, second and third front layers 22, 24, 26 and the first, second and third back layers 32, 34, 36 have a depth of approximately 30 nm (as measured in the vertical direction shown in FIGS. 2 and 3). As described above, each of the layers 22, 24, 26, 32, 34, 36 is formed of indium tin oxide. The work function of these indium tin oxide materials is configured during the fabrication of the corresponding layer by adjusting the oxygen flow rate, as is explained in more detail below.

Figure 4:
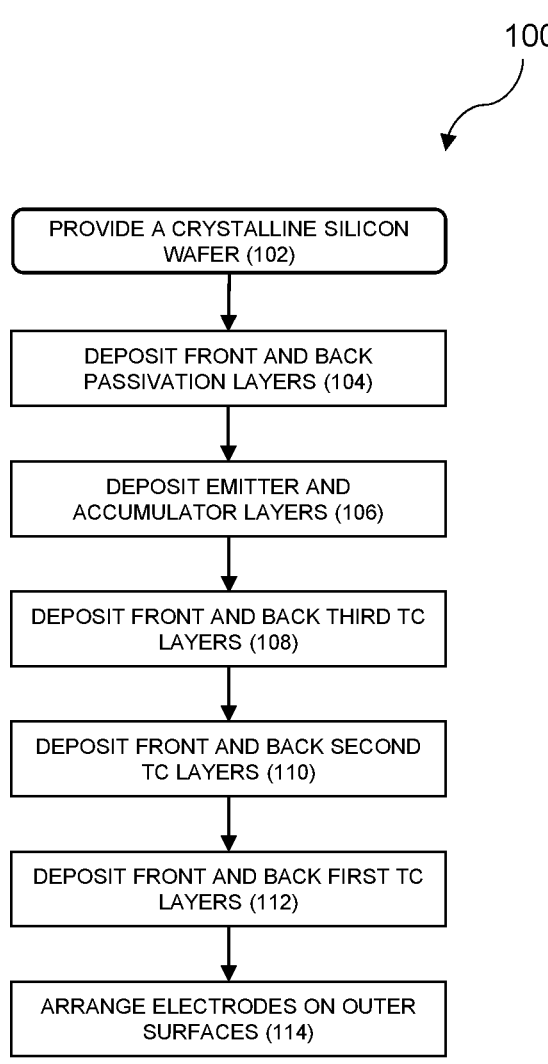
FIG. 4 is a flow chart illustrating a method of forming the solar cell of FIG. 1.

FIG. 4 depicts a method 100 of forming a solar cell, such as those described above. The method comprises a first step 102 of providing a crystalline silicon wafer to define the substrate 12 of the solar cell 10.

In a second method step 104, the method comprises depositing the front and back passivation layers 28, 30 onto the front and back surfaces 14, 16 of the substrate 12, respectively.

A third method step 106 comprises depositing the accumulator 52 and emitter 50 onto the front and back passivation layers 28, 30, respectively. Accordingly, the accumulator and emitter 52, 50 define front and back semiconductor layers, respectively.

The second and third method steps 104, 106 involve arranging (or forming) semiconductor layers on the front and rear surfaces 14, 16 of the silicon wafer substrate 12. This may comprise depositing, diffusing, doping and/or implantation steps. The layers referred to are those forming at least part of the front and rear portions 18, 20 of the solar cell 10 described above (e.g. emitter, accumulator and passivation layers etc.). Each of these steps involves depositing a corresponding semiconductor material using a vapour deposition process (e.g. PECVD). In general, the parameters of the vapour deposition process are configured to determine the composition (e.g. structural and/or chemical) and also the dopant concentration of each layer.

In the fourth method step 108, the method comprises depositing the front and back third layers 26, 36 onto the accumulator and emitter 52, 50, respectively. In a fifth step 110, the method comprises depositing the front and back second layers 24, 34 onto the respective front and back third layers 26, 36. In a sixth step 112, the method comprises depositing the front and back first layers 22, 32 onto the respective front and back second layers 24, 34.

Each of the fourth, fifth and sixth method steps 108, 110, 112, involves depositing front and back TCO layers onto the front and back surfaces of the solar cell 10. Each of these steps involves depositing a corresponding transparent conductive oxide material using a DC magnetron sputtering process. In general, the parameters of the sputtering process are configured to determine the composition (e.g. structural and/or chemical) and also the electrical and optical properties of each layer. For example, the work function of the constituent material of each of the front and back layers of the TC regions 46, 48 is determined by adjusting the parameters of the sputtering process. In particular, each of the layers of the front and back TC regions 46, 48 is deposited using a different oxygen gas flow-rate.

The method of depositing the first front layer 22 involves using a first oxygen flow rate to obtain the first work function. The method of depositing the second front layer 24 includes using a second oxygen flow rate to obtain the second work function. The method of depositing the third front layer 26 comprises a third oxygen flow rate to configure the third work function. The first oxygen flow rate of the first front layer 22 is greater than the second oxygen flow rate used to form the second front layer 24. The second oxygen flow rate of the second front layer 24 is greater than the third oxygen flow rate used to form the third front layer 26.

The method of depositing the first back layer 32 involves using a first oxygen flow rate in order to obtain the first work function. The method of depositing the second back layer 34 includes using a second oxygen flow rate to obtain the second work function. The method of depositing the third back layer 36 comprises a third oxygen flow rate to configure the third work function. The first oxygen flow rate of the first back layer 32 is smaller than the second oxygen flow rate used to form the second back layer 34. The second oxygen flow rate of the second back layer 34 is smaller than the third oxygen flow rate used to form the third back layer 36.

According to an exemplary arrangement of the invention, the front and back TC regions 46, 48 may be deposited separately. For example, the method steps 108, 110, 112 may be performed sequentially on the front side of the solar cell 10, before then performing the corresponding steps 108, 110, 112 on the back side of the solar cell 10. Alternatively, the back layers 32, 34, 36 may be deposited first, before then depositing the front layers 22, 24, 26.

Finally, a seventh method step 114 comprises arranging front and back electrodes 40, 42 on the outermost surfaces of the front and back portions 18, 20 of the solar cell 10.

It will be understood that the invention is not limited to the embodiments above-described and various modifications and improvements can be made without departing from the concepts described herein. Except where mutually exclusive, any of the features may be employed separately or in combination with any other features and the disclosure extends to and includes all combinations and sub-combinations of one or more features described herein.

The invention claimed is:

1. A solar cell comprising:
   a substrate comprised of crystalline silicon;
   a first semiconductor layer arranged on a back surface of the substrate;
   a second semiconductor layer arranged on a front surface of the substrate which is configured to face a radiative source, when the solar cell is in use;
   a first transparent-conductive region arranged on a surface of the first semiconductor layer, wherein the first transparent conductive region comprises:
      a first rear layer having a first rear work function; and
      a second rear layer having a second rear work function and being interposed between the first rear layer and the first semiconductor layer;
      wherein the second rear work function of the second rear layer is greater than the first rear work function of the first rear layer; and
   a second transparent-conductive region being arranged on a surface of the second semiconductor layer, wherein the second transparent-conductive region comprises:
   a first front layer having a first front work function; and
   a second front layer having a second front work function and being interposed between the first front layer and the second semiconductor layer; and
   a third front layer being interposed between the second front layer and the second semiconductor layer and arranged directly on the second semiconductor layer;
   wherein the second front work function of the second front layer is greater than the first front work function of the first front layer;
   wherein the third front layer is configured with a third front work function which is greater than the second front work function of the second front layer; and
   wherein the second semiconductor layer comprises amorphous silicon (a-Si).

2. The solar cell according to claim 1, wherein the first semiconductor layer is further configured with a positive conductivity type.

3. The solar cell according to claim 1, wherein the second rear work function of the second rear layer is configured to be less than the work function of the first semiconductor layer.

4. The solar cell according to claim 1, wherein a difference between the work function of the first semiconductor layer and the second rear work function of the second rear layer is less than the difference between the work function of the first semiconductor layer and the first rear work function of the first rear layer.

5. The solar cell according to claim 1, wherein the second rear work function of the second rear layer is configured to be up to 15% greater than the first rear work function of the first rear layer.

6. The solar cell according to claim 1, wherein the first transparent-conductive region comprises a third rear layer being interposed between the second rear layer and the first semiconductor layer, wherein the third rear layer is configured with a third rear work function which is greater than the second rear work function of the second rear layer.

7. The solar cell according to claim 6, wherein the third rear layer is arranged directly on the first semiconductor layer.

8. The solar cell according to claim 7, wherein the third rear work function of the third rear layer is configured to be up to 15% greater than the second rear work function of the second rear layer.

9. The solar cell according to claim 7, wherein the third rear work function of the third rear layer is configured to be less than the work function of the first semiconductor layer.

10. The solar cell according to claim 1, wherein the work function of a layer of the first transparent-conductive region that is furthest from the substrate is greater than 3.5 eV and less than 4.5 eV, and/or the work function of a layer of the first transparent-conductive region that is closest to the substrate is greater than 5.0 eV and less than 6.0 eV.

11. The solar cell according to claim 1, wherein the work function of the first semiconductor layer is greater than 5.0 eV and less than 6.0 eV.

12. The solar cell according to claim 6, wherein the first transparent-conductive region has a thickness of less than 500 nm, and wherein each of the layers of the first transparent-conductive region has a thickness of at least 20 nm and no more than 50 nm.

13. The solar cell according to claim 6, wherein at least one of the layers of the first transparent-conductive region is formed of a metal oxide material, and the first semiconductor layer is comprised of amorphous silicon (a-Si).

14. The solar cell according to claim 1, wherein the second semiconductor layer is configured with a negative conductivity type.

15. The solar cell according to claim 1, wherein the second semiconductor layer defines an accumulator layer.

16. The solar cell according to claim 1, wherein at least one of the layers of the second transparent-conductive region is formed of a metal oxide material.

17. A solar module comprising a plurality of solar cells according to claim 1, wherein the plurality of solar cells are electrically coupled together.

18. The solar cell according to claim 1, wherein the second rear work function of the second rear layer is configured to be up to 10% greater than the first rear work function of the first rear layer.

19. The solar cell according to claim 1, wherein the second rear work function of the second rear layer is configured to be at least 10% and up to 15% greater than the first rear work function of the first rear layer.

20. The solar cell according to claim 6, wherein the third rear work function of the third rear layer is up to 10% greater than the second rear work function of the second rear layer.

* * * * *